United States Patent [19]

Jolley

[11] Patent Number: 5,489,557
[45] Date of Patent: Feb. 6, 1996

[54] METHODS FOR PROCESSING SEMICONDUCTORS TO REDUCE SURFACE PARTICLES

[75] Inventor: Michael K. Jolley, Kalispell, Mont.

[73] Assignee: Semitool, Inc., Kalispell, Mont.

[21] Appl. No.: 391,724

[22] Filed: Feb. 21, 1995

Related U.S. Application Data

[63] Continuation of Ser. No. 100,537, Jul. 30, 1993, abandoned.

[51] Int. Cl.$^6$ .................................................. H01L 21/00
[52] U.S. Cl. ............................... 156/640.1; 156/651.1; 156/662.1; 134/3; 134/4; 134/28
[58] Field of Search ............................ 156/640.1, 651.1, 156/662.1; 134/2, 3, 4, 26, 28

[56] References Cited

U.S. PATENT DOCUMENTS

| | | | |
|---|---|---|---|
| 3,898,141 | 8/1975 | Ermanis et al. | 204/129.43 |
| 4,050,954 | 9/1977 | Basi | 134/2 |
| 4,261,791 | 4/1981 | Shwartzman | 134/4 X |
| 4,264,374 | 4/1981 | Beyer et al. | 134/2 |
| 4,615,762 | 10/1986 | Jastrzebski et al. | 156/628.1 |
| 4,899,767 | 2/1990 | McConnell et al. | 134/56 R |
| 4,943,540 | 7/1990 | Ren et al. | 437/225 |
| 4,971,654 | 11/1990 | Schnegg et al. | 156/638.1 |
| 5,129,955 | 7/1992 | Tanaka | 134/2 |
| 5,158,100 | 10/1992 | Tanaka et al. | 1234/105 |
| 5,181,985 | 1/1993 | Lampert et al. | 134/11 X |
| 5,221,423 | 6/1993 | Sugino et al. | 134/1 X |
| 5,294,570 | 3/1994 | Fleming, Jr. et al. | 134/3 X |

FOREIGN PATENT DOCUMENTS

| | | |
|---|---|---|
| 0472441A1 | 8/1991 | European Pat. Off. . |
| 0548596A2 | 11/1992 | European Pat. Off. . |
| 62-118528 | 5/1987 | Japan . |
| 5-183151 | 7/1993 | Japan . |

OTHER PUBLICATIONS

Yuji Takakuwa et al.; "Low–Temperature Cleaning of HF–Passivated Si(111) Surface with VUV Light"; pp. 1274–1277 Japanese Journal of Applied Physics, 28 (1989) Jul., Part 2, Tokyo, JP.

*Primary Examiner*—Thi Dang
*Attorney, Agent, or Firm*—Wells, St. John, Roberts, Gregory & Matkin

[57] ABSTRACT

Methods for removing particulates from the surfaces of semiconductor materials, such as silicon substrates and wafers. The methods use repeated oxide growth steps and intervening oxide removal. Rinses are preferably used between the oxide growth and removal steps, such as with purified water. The oxide growth steps use an oxidation agent and a base, for example hydrogen peroxide and ammonium hydroxide. The oxide removal steps use a suitable oxide removal agent such as a hydrogen halide acid, for example hydrogen fluoride.

21 Claims, No Drawings

METHODS FOR PROCESSING SEMICONDUCTORS TO REDUCE SURFACE PARTICLES

RELATED PATENT DATA

This application is a continuation application of U.S. patent application Ser. No. 08/100,537, filed on Jul. 30, 1993, now abandoned.

TECHNICAL FIELD

This invention relates to processes for cleaning semiconductor materials to reduce the presence of contaminating materials present on the surfaces of these materials.

BACKGROUND OF THE INVENTION

The production of semiconductors into various types of integrated circuits, displays, memories, sensors and other devices typically requires that contaminating particles be minimized. In many cases the presence of contaminating particles can cause defective operation, performance problems, or render the device inoperable.

It has previously been typical for silicon wafers to be processed using a method commonly referred to as the "RCA clean". In this process the silicon wafer, substrate, or other item is first cleaned with an aqueous solution of sulfuric acid and hydrogen peroxide to remove organic contaminants. This is followed by treatment with an aqueous solution of ammonium hydroxide and hydrogen peroxide. After this the wafers are rinsed with deionized water.

The RCA clean also typically involves stripping the silicon dioxide layer formed in the previous steps using an aqueous hydrofluoric acid solution. The hydrofluoric acid solution removes the silicon dioxide layer leaving bare silicon. The bare silicon demonstrates the property of not being easily wetted and is frequently referred to as being "hydrophobic". This should be contrasted with the silicon dioxide surface existing prior to this step, which is easily wetted and the wafer is commonly called "hydrophilic".

The hydrofluoric acid oxide removal step is typically followed by a short rinse in deionized water. The rinse is kept short to minimize silicon dioxide formation. The rinsed wafer is typically not dried.

The RCA clean method also typically includes transferring the wet wafer from the previous step into an aqueous solution of hydrochloric acid and hydrogen peroxide. This step is designed to dissolve metals.

Although this sequence of processing steps is widely used, it is recognized that the process is of limited effectiveness for removing surface adhering particles. The effectiveness is limited to a certain level of particle contamination dependent upon prior processing and the level of cleanliness existing on the wafer when the cleaning process is begun.

The cleaning of semiconductor surfaces has great economic significance because of the volume of integrated circuits and other semiconductor devices being produced, and the significant percentage of processed semiconductor devices which are rejected due to defects caused by particle contamination. Particle contamination is also of great significance because of increased facilities and equipment cost, and costly and time-consuming procedures used in an effort to prevent particle contamination. It is generally recognized that contamination must be prevented because it is often difficult or impossible to adequately remove contaminants once contamination has occurred.

Thus there has long remained a need for improved cleaning processes which are effective at removing particulate contaminants from the surface of silicon and other semiconductor materials.

BRIEF DESCRIPTION OF THE DRAWINGS

One or more preferred forms of the invention are described herein with reference to the accompanying drawings. The drawings are briefly described below.

None.

DETAILED DESCRIPTION OF THE PREFERRED EMBODIMENTS

This disclosure of the invention is submitted in furtherance of the constitutional purposes of the U.S. Patent Laws "to promote the progress of science and useful arts"(Article 1, Section 8).

Methods according to this invention include repeated treatment of a semiconductor surface with an oxidation agent and a base. The oxidation agent and base are preferably presented combined together in a liquid mixture or solution with a diluent. The diluent is preferably a solvent diluent, most preferably purified water.

Examples of suitable oxidation agents include a suitable peroxide, such a hydrogen peroxide ($H_2O_2$). The oxidation agent or agents are preferably in solution with a suitable diluent, preferably a suitable solvent, such as purified water. An alternative oxidation agent is ozone. The ozone can be bubbled into a purified solvent diluent, preferably purified water, to achieve an ozonized water oxidizing agent. The concentration of the ozone is preferably at the saturation point for the desired processing temperatures.

The oxidation agent is provided in a suitable concentration to achieve a rate of oxidation which provides oxide layer growth of the desired amount for the processing conditions and time being used. In the preferred oxidation agent-base mixture, hydrogen peroxide can be present in quantities sufficient to provide molar ratios in the range of approximately 5:2 to approximately 50:1, more preferably approximately 5:1 to 10:1, even more preferably approximately 5:1 (water:hydrogen peroxide).

The preferred mixture or solution containing the oxidation agent also includes a suitable base. The base is believed to provide solubilizing properties and create similar electrostatic charge conditions on particles and the semiconductor surface which cause the particles to be repelled and reducing the risk of particle reattachment. The base is advantageously a hydroxide. The base is preferably selected from the group consisting of ammonium hydroxide ($NH_4OH$), sodium hydroxide (NaOH), potassium hydroxide (KOH), and quaternary ammonium compounds, such as choline ($C_5H_{14}NO^+$), and tetramethylammonium hydroxide (($CH_3)_4NOH$).

The base or bases which are included in the oxidation agent-base mixture are preferably provided in sufficient amounts to provide a pH in the approximate range 7.001 to 14. For the most preferred base, ammonium hydroxide, and other bases of similar activity, the base is advantageously included in molar ratio relative to the preferred diluent solvent water to provide ranges of approximately 500:1 to 5:2, more preferably 100:1 to 5:1, most preferably 20:1 (water:ammonium hydroxide).

The concentration of the base is also related to the concentration of the oxidation agent. The oxidation agent provides cleaning properties and promotes oxidation of the semiconductor surface. If the base acts as an etchant, such as ammonium hydroxide does against silicon, then the oxidation agent must be in sufficient concentration to provide an oxidation rate of the semiconductor material which produces a net growth rate against the rate of etching caused by the base. In the preferred oxidation agent-base mixtures for silicon comprising water, hydrogen peroxide, and ammonium hydroxide, the ratios are in the range of approximately 10:1:1 to approximately 100:1:0.1.

The novel methods of this invention also preferably comprise one or more steps wherein the oxide coated surface of the semiconductor material is exposed to an oxide removal agent. The oxide removal agent is selected to be effective against the oxide developed in prior processing. In the preferred case of oxide removal after a prior treatment with the oxidation agent-base mixture, the oxide removal agent is selected to effectively remove the oxide developed by the reaction of the oxidation agent-base mixture upon the semiconductor surface involved.

The oxide removal agent is advantageously selected from the group of hydrogen halide acids. In the case of silicon the preferred oxide removal agent is hydrogen fluoride.

The oxide removal agent is preferably presented to the semiconductor surface in the form of a liquid mixture or solution with a suitable diluent, which is preferably a diluent solvent, such as the preferred purified water. The concentration of the oxide removal agent in the diluent or solvent is determined by the reactivity of the oxide removal agent against the oxide being removed and the need for uniform and repeatable reaction rates. In the preferred methods for treatment of silicon the oxide removal agent is relatively dilute hydrogen fluoride. Concentrations of hydrogen fluoride are preferably in the range of approximately 10,000:1 to 10:1, more preferably approximately 1,000:1 to 100:1, even more preferably 500:1 (water:hydrogen fluoride).

The novel methods according to this invention include repeated treatments with the oxidation agent-base with intervening oxide removal using the oxide removal agent. The oxide removal is preferably done at a rate and for a time sufficient to remove at least half but less than all of the semiconductor oxide layer existing on the surface of the semiconductor material. More preferably the oxide removal agent is used to remove at least two-thirds of the surface oxide layer but less than all. Even more preferably the oxide removal agent step removes between two-thirds and three-fourths of the surface oxide layer.

It is important to recognize that prior art cleaning methods involved taking the entire surface oxide layer from the semiconductor material. In the case of silicon, this caused the surface to become hydrophobic. The novel methods of this invention keep the semiconductor surface in a hydrophilic condition. Thus the oxide removal step should not be allowed to remove all the oxide otherwise the surface will go hydrophobic and the effectiveness of the methods will be significantly depreciated.

The repeated alternating treatments with the oxidizing agent-base and oxide removal agent are preferably separated by intervening or intermediate rinsing steps. These intervening rinsing steps are preferably accomplished using a suitable diluent or solvent, more preferably a solvent which can help to carry away loosened particles. The solvent or other diluent is preferably selected to be a common diluent or solvent present in both the oxidizing agent-base treatments and oxide removal treatments. Most preferably the rinsing is accomplished using purified water. The purified water is preferably deionized water of high resistivity, or distilled and deionized water of high resistivity, such as 10 megohms or greater resistivity. The use of intervening water or other rinses arrests or inhibits the oxidation and effects of the base. The rinses also inhibit or arrest the action of the oxide removal agent when performed after such processing. The rinsing steps are preferably accomplished at room temperatures, 15°–25° C., for periods of approximately 30 seconds to 5 minutes, more preferably 1–3 minutes, even more preferably approximately 2 minutes.

The various processing steps used in the novel processes of this invention are most preferably accomplished within a substantially enclosed processing chamber using liquids of very high purity which are sprayed on the semiconductor surfaces. Most preferably the liquids are sprayed on wafers, substrates or other semiconductor materials which are being rotated or otherwise spun or moved as the liquids are sprayed upon the surfaces. The centrifugal forces developed by the rotating wafers help to provide uniform and even distribution of the liquids across the entire surface. The spinning action also moves the liquids from the processed surface or surfaces thus better preparing the surface for subsequent processing. Preferred rotation speeds are in the range of approximately 30–3000 rpm, more preferably 30–1,000 rpm, even more preferably 30–600 rpm.

The centrifugal processing also is more convenient in that it allows the repeated alternate processing steps to be preformed numerous times, as desired without intervening handling or drying of the wafers. A preferred centrifugal processing apparatuses for carrying out the novel methods include Semitool models SAT 2080S or SAT5061T, available from Semitool, Inc. of Kalispell, Mont.

Example 1

Twenty five (25) six inch diameter (150 mm) silicon wafers were loaded into a wafer holder. The wafers had previously been used for testing and were considered dirty. The wafers suffered from general contamination and room dust accumulations. Testing was being done to reclean the wafers. The wafers thus had some oxide surface layer formed thereon due to the development of silicon oxide from exposure to air.

The wafers were processed in a centrifugal spray processor Semitool model 2080S for all steps except final rinsing and drying which were performed in a spin rinser dryer. The initial oxidation-base treatment was performed in a 5:1:0.25 mixture of water:hydrogen peroxide:ammonium hydroxide at 80° C. for periods range between 3–10 minutes. The wafers were spun at speeds of approximately 35 rpm during this step. The mixture returned to the processing fluid tanks for subsequent reuse.

Following the oxidation-base treatment, the wafers were rinsed in deionized water at 20° C. for 2 minutes. During the rinse cycle the wafers were spun for a period of 1 minute at 35 rpm, and for an additional 1 minute at 300 rpm.

The rinse cycle was followed by oxide removal using a 500:1 water:hydrogen fluoride mixture. The exposure to the oxide removal agent was accomplished at 20° C. for 1–2 minutes at rotational speeds of 35 rpm. The mixture was filtered and returned to the processing fluid tanks for subsequent reuse.

The oxide removal processing was followed by another rinse cycle using deionized water as explained above.

After the second rinse the wafers were treated a second time using the same oxidation agent-base aqueous mixture as recited above and under the same operational conditions.

The second treatment with the oxidation agent and base was following by another deionized water rinse cycle as explained above.

After the previous rinse step, a second oxidation removal treatment was performed using the same conditions and processing as explained above for the first oxide removal treatment.

Another deionized water rinse was then performed in the manner explained above.

The wafers were then treated a third time using the same oxidation agent-base and water mixture and processing conditions as explained above.

Thereafter the wafers were rinsed a further time and spun to dry in a nitrogen purged processing chamber at approximately 80° C.

Analysis of the processed wafers showed particle count reductions after the above processing of approximately 98% percent removal. The wafers showed average total particle counts of less than 50 particles per wafer for particles of size 0.2 micron or greater after the processing.

EXAMPLE 2

Two (2) previously cleaned wafers having particle counts of less than 100 particles per wafer of size 0.2 micron or larger were further processed using HF to remove all native oxide developed on the wafers since the prior cleaning. The wafers were rinsed and dried and then particle counted again. The resulting wafers demonstrated hydrophobic surfaces and particle counts greatly higher than the 100 particles per wafer. Specifically, Wafer #1 had 21,083 particles and Wafer #2 had 31,456 particles.

The two hydrophobic wafers were further processed in a manner similar to that explained in Example 1 except that the sequence of oxidation-base treatments, rinses, and oxide removal steps were repeated so that there was a total of four (4) oxidation-base treatments lasting 5 minutes each, and a total of three (3) oxide removal steps lasting 40 seconds each.

After the above processing wafer #1 had 108 particles and wafer #2 had 80 particles.

EXAMPLE 3

Silicon wafers 200 millimeters in diameter were polished using a chemical-abrasive slurry. Removing the slurry is a significant cleaning challenge. The wafers with slurry were first rinsed with deionized water using a centrifugal spray acid processor. This preliminary step was used to remove the excess slurry. The resulting wet wafers were further processed in the same machine using substantially the same sequence as described in Example 1, except the oxidation-base steps were performed for periods of 5 minutes, and the oxide removal steps were performed for periods of 2 minutes 15 seconds. A finish spin rinse and dry were performed in a centrifugal spin rinser dryer.

The processing described above resulted in wafer #1 having particle counts of 31 prior to slurry polishing and 46 after slurry polishing and cleaning using the described process. Wafer #2 had particles counts of 30 before slurry polishing and 22 after slurry polishing and cleaning using the described process.

The cleaning performance described above in this Example must be contrasted with a control group of two wafers which were merely rinsed in the spray acid processor and then rinsed and dried using deionized water in the centrifugal spin rinser dryer. The wafers in this control group had particle counts of 38 and 27 before slurry polishing versus 1220 and 1188, respectively, after slurry polishing and the simple rinsing and drying steps.

EXAMPLE 4

A modified cleaning process similar to that used on the first group of wafers described in Example 3 was also performed on a third group of two wafers. The process varied in that the initial rinsing step was first followed by the described oxide removal step instead of first using the oxidation-base step. This starting oxide removal could be employed because the oxide layer from previous processing of the wafers was sufficiently thick to prevent total removal of the oxide layer. Thus the wafer did not turn hydrophobic. Two oxide removal and two oxidation-base processing sub-routines were performed with associated intervening rinses as described above.

The wafers processed in this testing demonstrated particle counts of 48 and 22 before slurry polishing versus 25 and 19, respectively, after slurry polishing and the described cleaning process.

EXAMPLE 5

Silicon wafers 200 millimeters in diameter were used for oxide growth uniformity testing. The wafers were initially treated with an oxidation-base step as described in Example 1. Thereafter the wafers were totally stripped of the oxide layer by removing approximately 80 Angstroms of grown oxide using a spray water:HF solution (500:1 water:HF). This stripping operation is typically used to strip oxide to prepare the wafer for subsequent thermal diffusion processing.

The resulting hydrophobic, oxide-stripped wafers were then cleaned using a process similar to that described in Example 1. The oxidation base steps were performed for 10 minutes, and the oxide removal steps were performed for 1 minute.

The particle counts before cleaning were 670 particles and after the described processing 64 particles.

The particle removal mechanisms performed by the novel processes are not understood with certainty. However, it is hypothesized that the oxide growth phase in the presence of a base creates a growing oxide layer which induces substantial compressive film stresses. These compressive film stresses in the growing oxide layer are believed to separate previously attached particles from the surface. The presence of the base in the processing mixture causes the particle and surface of the semiconductor to both be similarly charged. This like charge state is believed to mitigate against subsequent particle reattachment to the surface.

The oxide removal process step is believed to cause oxide removal from about embedded particles and thus leave them mechanically susceptible to being solubilized and rinsed away. Maintaining the wafer surface with at least some oxide layer maintains the protective oxide over the more adherent bare silicon or other semiconductor material.

Although this explanation is believed accurate, the exact mechanism for the superior cleaning efficacy of the novel methods of this invention are have not yet been adequately proven and may occur due to other mechanisms.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

I claim:

1. A method for processing a surface of semiconductor material using liquids to remove particles therefrom, characterized by:
   a) treating said surface using an oxide growth liquid to perform an oxide growth step in which an increased thickness of semiconductor oxide is formed along the surface; said oxide growth liquid including a suitable oxidation agent;
   b) treating said surface using an oxide removal liquid to perform an oxide removal step in which semiconductor oxide is removed to provide a decreased thickness of semiconductor oxide along said surface;
   c) maintaining a semiconductor oxide layer upon the surface throughout steps a) and b) to prevent the surface from becoming hydrophobic;
   d) treating said surface at least a second time using an oxide growth liquid to perform at least a second oxide growth step in which an increased thickness of semiconductor oxide is formed along the surface; said oxide growth liquid including a suitable oxidation agent;
   e) treating said surface at least a second time using an oxide removal liquid to perform an oxide removal step in which semiconductor oxide is removed to provide a decreased thickness of semiconductor oxide along said surface;
   f) maintaining a semiconductor oxide layer upon the surface throughout steps d) and e) to prevent the surface from becoming hydrophobic.

2. A method according to claim 1 and further characterized by rotating the surface while the liquids are sprayed onto the surface.

3. A method according to claim 1 and further characterized by rotating the surface at rotational speeds in the range of approximately 30–3000 revolutions per minute while the liquids are sprayed onto the surface.

4. A method according to claim 1 and further characterized by rotating the surface at rotational speeds in the range of approximately 30–600 revolutions per minute while the liquids are sprayed onto the surface.

5. A method according to claim 1 and further characterized in that steps b) and e) remove at least half and less than all of the semiconductor oxide layer existing along the surface.

6. A method according to claim 1 and further characterized in that steps b) and e) remove at least two-thirds and less than all of the semiconductor oxide layer existing along the surface.

7. A method according to claim 1 and further characterized in that steps b) and e) remove in the range of approximately two-thirds to three-fourths of the semiconductor oxide layer existing along the surface.

8. A method according to claim 1 and further characterized by rinsing the semiconductor surface between said treating steps using a solvent.

9. A method according to claim 1 and further characterized by repeating each of steps d), e) and f) at least one additional time.

10. A method according to claim 1 and further characterized in that said oxidation agent includes at least one constituent selected from the group consisting of hydrogen peroxide and ozone.

11. A method according to claim 1 and further characterized in that said oxidation agent includes at least one peroxide.

12. A method according to claim 1 and further characterized in that said oxidation agent includes hydrogen peroxide in an aqueous solution in the range of approximately 5:2 to approximately 50:1 (water:hydrogen peroxide).

13. A method according to claim 1 and further characterized in that said oxide growth liquid includes a base having at least one hydroxide.

14. A method according to claim 1 and further characterized in that said oxide growth liquid includes a base having at least one selected from the group consisting of: ammonium hydroxide, sodium hydroxide, choline, tetramethylammonium hydroxide, and other quaternary ammonium compounds.

15. A method according to claim 1 and further characterized in that said oxide growth liquid includes a base having at least ammonium hydroxide.

16. A method according to claim 1 and further characterized in that said oxide growth liquid includes a base having ammonium hydroxide in an aqueous solution in the range of approximately 5:1 to approximately 100:1 (water:ammonium hydroxide).

17. A method according to claim 1 and further characterized in that said oxide growth liquid includes a base having at least ammonium hydroxide, and said oxidation agent includes at least one constituent selected from the group consisting of hydrogen peroxide and ozone.

18. A method according to claim 1 and further characterized in that said oxide removal agent includes an aqueous hydrogen halide.

19. A method according to claim 1 and further characterized in that said oxide removal agent includes hydrogen fluoride.

20. A method according to claim 1 and further characterized in that said oxide removal agent includes hydrogen fluoride in an aqueous solution in the range of approximately 10:1 to 10,000:1 (water:hydrogen fluoride).

21. A method according to claim 1 and further characterized in that said oxide removal agent includes hydrogen fluoride in an aqueous solution in the range of approximately 100:1 to 1,000:1 (water:hydrogen fluoride).

* * * * *